United States Patent
Lee

(10) Patent No.: US 8,212,694 B2
(45) Date of Patent: Jul. 3, 2012

(54) DATA OUTPUT CIRCUIT

(75) Inventor: Dong Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 43 days.

(21) Appl. No.: 12/833,089

(22) Filed: Jul. 9, 2010

(65) Prior Publication Data

US 2011/0156938 A1 Jun. 30, 2011

(30) Foreign Application Priority Data

Dec. 28, 2009 (KR) .................. 10-2009-0131759

(51) Int. Cl.
*H03M 9/00* (2006.01)

(52) U.S. Cl. ........................ 341/101; 341/100

(58) Field of Classification Search .......... 341/101, 341/100; 365/201, 185.09
See application file for complete search history.

(56) References Cited

U.S. PATENT DOCUMENTS

| | | | |
|---|---|---|---|
| 6,243,302 B1 | 6/2001 | Yoon et al. | |
| 6,288,947 B1 | 9/2001 | Kim et al. | |
| 6,304,504 B1 * | 10/2001 | Chevallier et al. | ............ 365/201 |
| 6,724,684 B2 | 4/2004 | Kim | |
| 7,321,998 B2 * | 1/2008 | Her et al. | ............ 714/724 |
| 7,420,789 B2 | 9/2008 | Chen | |
| 7,508,232 B2 | 3/2009 | Lee et al. | |
| 7,593,202 B2 | 9/2009 | Khazhinsky et al. | |
| 2009/0016119 A1 | 1/2009 | Jang | |
| 2009/0322667 A1 * | 12/2009 | Peng et al. | ............ 345/98 |

FOREIGN PATENT DOCUMENTS

| | | |
|---|---|---|
| KR | 1020050091494 A | 9/2005 |
| KR | 1020070063289 A | 6/2007 |

* cited by examiner

*Primary Examiner* — Brian Young
(74) *Attorney, Agent, or Firm* — Ladas & Parry LLP

(57) ABSTRACT

A data output circuit is presented. The data output circuit includes: a data serializer and a driver. The data serializer is configured to generate serial data using first parallel data. The driver is configured to drive the serial data to generate output data. The data serializer is also configured to generate the serial data by multiplexing second parallel data generated by changing a power domain of the first parallel data.

16 Claims, 8 Drawing Sheets

DATA OUTPUT CIRCUIT

CROSS-REFERENCES TO RELATED APPLICATION

The present application claims priority under 35 U.S.C. §119(a) to Korean application number 10-2009-0131759, filed on Dec. 28, 2009, in the Korean Intellectual Property Office, which is incorporated herein by reference in its entirety as set forth in full.

BACKGROUND

1. Technical Field

The present invention relates to a semiconductor circuit, and more particularly, to a data output circuit.

2. Related Art

In general, a semiconductor circuit includes a data output circuit which provides data required from outside at a predetermined timing.

Presently, data output circuits include a plurality of circuit components configured to transfer and receive signals. When they use different power domains, the power domains should be reconciled with one another.

For example, semiconductor memories use a variety of power domains such as a VDD power domain using an external voltage VDD, a VDDI power domain using an internal voltage VDDI generated by using an external voltage VDD, and a VDDQ power domain using another external voltage VDDQ.

SUMMARY

In one embodiment of the present invention, a data output circuit includes: a data serializer configured to generate serial data using first parallel data; and a driver configured to drive the serial data to generate output data.

The data serializer is configured to generate the serial data by multiplexing second parallel data generated by changing a power domain of the first parallel data.

In another embodiment of the present invention, a data output circuit includes: a power domain changing unit configured to change power domains of a plurality of first clock signals to generate a plurality of second clock signals; and an output unit configured to selectively output a plurality of level shifted data generated by is shifting voltage levels of a plurality of data, in response to the plurality of second clock signals.

In another embodiment of the present invention, a data output circuit includes: a power domain changing unit configured to change power domains of a plurality of first clock signals having multiple phases and generate a plurality of second clock signals having multiple phases; a plurality of output units configured to commonly receive the plurality of second clock signals and respectively receive a plurality of first data sets; and a plurality of repeaters configured to transfer the plurality of second clock signals to the plurality of output units. Each of the output units is configured to selectively output a second data set generated by changing a power domain of the first data set, in response to the plurality of second clock signals.

BRIEF DESCRIPTION OF THE DRAWINGS

Features, aspects, and embodiments are described in conjunction with the attached drawings, in which.

DETAILED DESCRIPTION

Hereinafter, a data output circuit according to the present invention will be described below with reference to the accompanying drawings through preferred embodiments.

Figure 1:
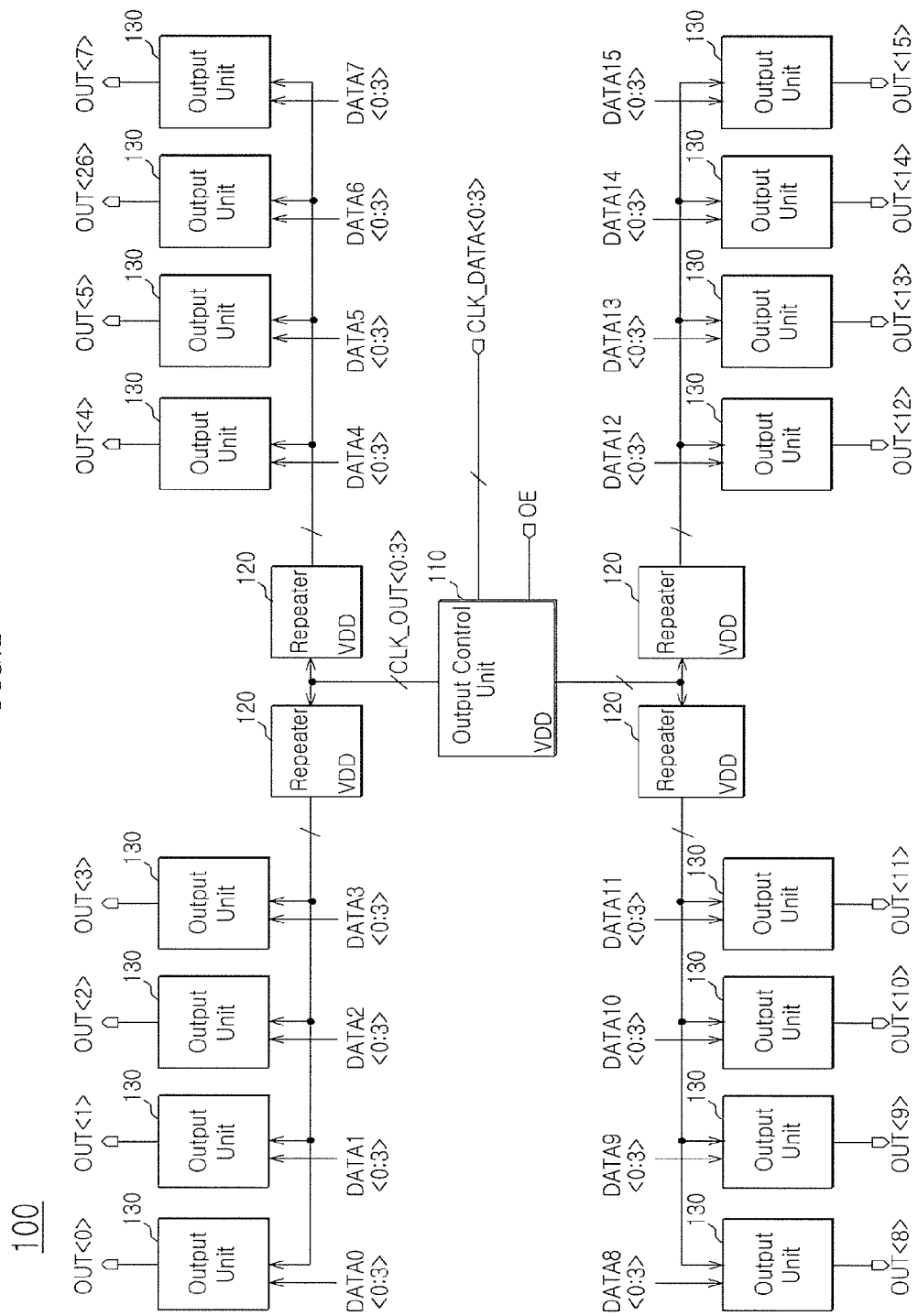
FIG. 1 is a block diagram of a data output circuit according to one embodiment.

FIG. 1 illustrates an example in which a data output circuit 100 according to one embodiment outputs 16 (I/O number)*4 (prefetch) data. The data output circuit 100 includes an output control unit 110, a plurality of repeaters 120, and a plurality of output units 130.

The output control unit 110 is configured to output data clock signals CLK_DATA<0:3> corresponding to an activation interval of an output control signal OE as data output clock signals CLK_OUT<0:3>.

The plurality of repeaters 120 are configured to prevent or at least protect against signal attenuation from occurring while the data clock signals CLK_DATA<0:3> are transferred to the plurality of is output units 130.

The plurality of output units 130 are configured to serially convert parallel data DATA0<0:3> through DATA15<0:3> in response to the data output clock signals CLK_OUT<0:3> and to generate output data OUT<0:15>.

Figure 2:
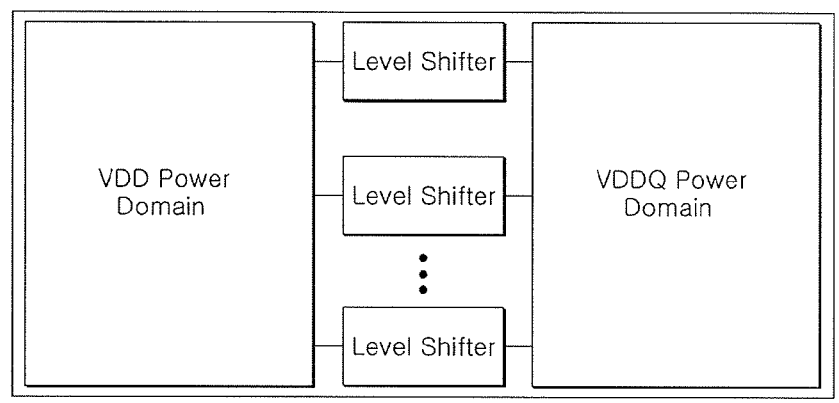
FIGS. 2 and 3 are block diagrams illustrating circuit configuration examples of an output unit of FIG. 1.

Referring to FIG. 2, each of the output units 130 may be divided into a VDD power domain and a VDDQ power domain. To reconcile the different power domains, level shifters using the VDDQ power domain may be arranged in the output unit 130.

Figure 3:
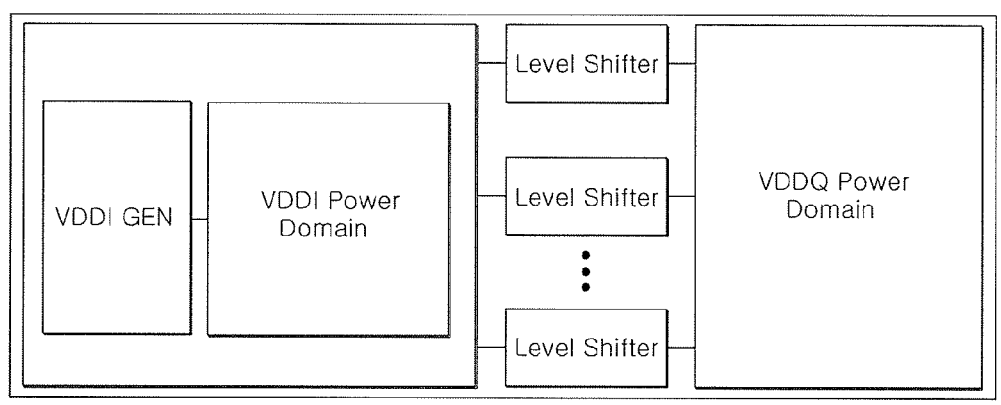

Alternatively, referring to FIG. 3, each of the output units 130 may be divided into a VDDI power domain and a VDDQ power domain. To reconcile the different power domains, level shifters using the VDDQ power domain may be arranged in the output unit 130.

Figure 4:
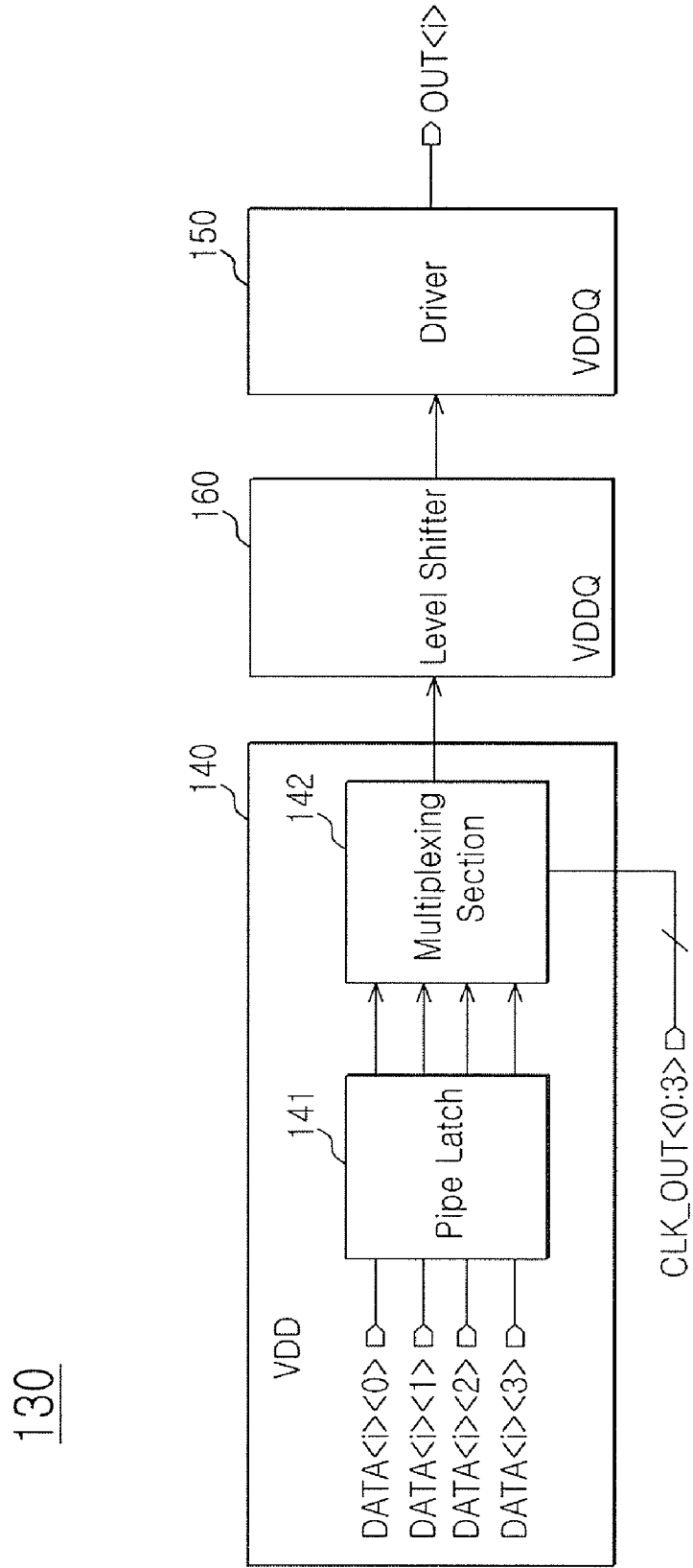
FIG. 4 is a block diagram illustrating the internal configuration of the output unit of FIG. 3.

Referring to FIG. 4, the output unit 130 includes a data serializer 140, a driver 150, and a level shifter 160.

The data serializer 140 includes a pipe latch 141 and a multiplexing section 142.

The data serializer 140 and the driver 150 are shown to have different voltage levels in their respective power domains. For example, the power domain of the data serializer 140 is VDD, but the power domain of the driver 150 is VDDQ.

Therefore, the level shifter 160 is disposed between an output terminal of the multiplexing section 142 and an input terminal of the driver 150, in order to reconcile the power domain of an output signal of the data serializer 140 with the power domain of the driver 150. In this exemplary embodiment, the power domain of the level shifter 160 is VDDQ.

The multiplexing section 142 is configured to select parallel data DATA<i><0:3> latched by the pipe latch 141 one by one in response to the data output clock signals CLK- _OUT<0:3>, and configured to output the selected data as serial data. In this exemplary embodiment, i may indicate a number between 0 and 15.

The level shifter 160 is configured to shift the level of the serial data outputted from the multiplexing section 142 to the VDDQ level, and to provide the shifted serial data to the driver 150.

The driver 150 is configured to drive the output of the level shifter 160 and generate output data OUT<i>. In this exemplary embodiment, i may indicate a number between 0 and 15.

Figure 5:
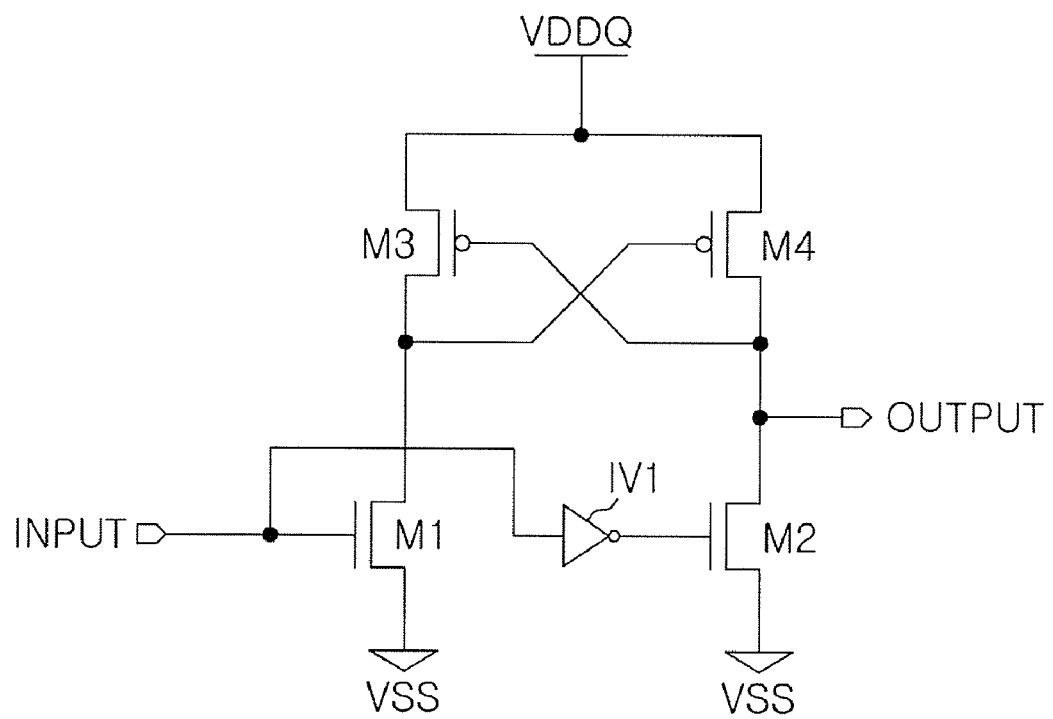
FIG. 5 is a circuit diagram of a level shifter of FIG. 4.

Referring to FIG. 5, one exemplary embodiment of the level shifter 160 is shown to include a plurality of transistors M1 through M4 and an inverter IV1, and to use VDDQ as a power domain.

Figure 6:
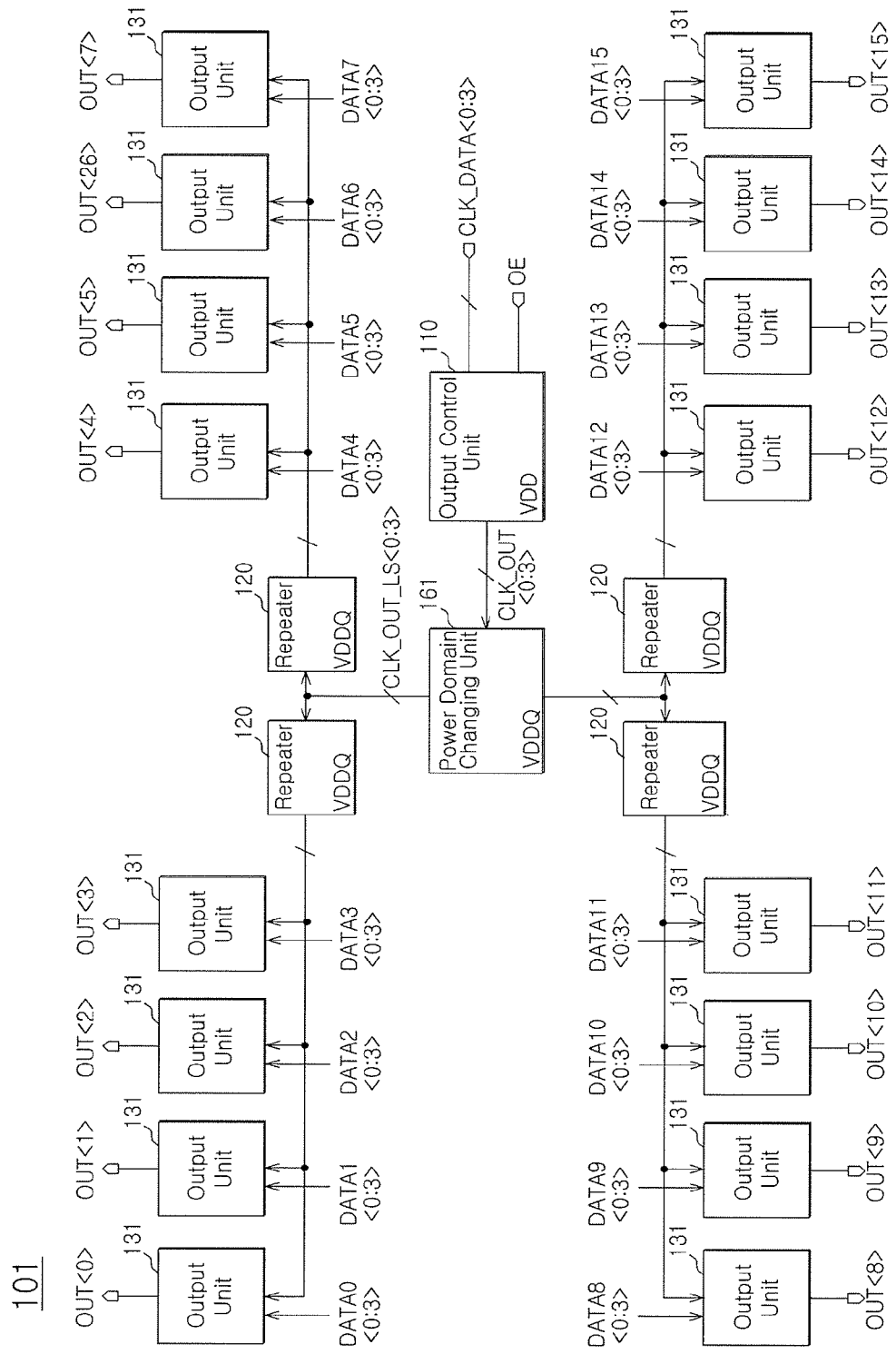
FIG. 6 is a block diagram of a data output circuit according to another embodiment.

FIG. 6 illustrates an example in which a data output circuit 101 according to another embodiment outputs 16 (I/O number)*4 (prefetch) data. The data output circuit according to the embodiment includes an output control unit 110, a power domain changing unit 161, a plurality of repeaters 120, and a plurality of output units 131.

The output control unit 110 is configured to output data clock signals CLK_DATA<0:3> corresponding to an activation interval of an output control signal OE as a plurality of first clock signals, that is, data output clock signals CLK_OUT<0:3>. In this exemplary embodiment, the output control unit 110 uses VDD as the power domain.

The power domain changing unit 161 is configured to change the power domains of the data output clock signals CLK_OUT<0:3> and to generate a plurality of second clock signals, that is, to generate level shifted clock signals CLK_OUT_LS<0:3>.

The power domain changing unit 161 is configured to shift the level of the data output clock signals CLK_OUT<0:3> at the VDD level, and to generate level shifted clock signals CLK_OUT_LS<0:3> at the VDDQ level.

The plurality of repeaters 120 are configured to prevent or at least protect against signal attenuation that might occur when the data clock signals CLK_DATA<0:3> are transferred to the plurality of output units 131. In this exemplary embodiment, since the power domain of the level shifted clock signals CLK_OUT_LS<0:3> is VDDQ, then the plurality of repeaters 120 use VDDQ as a power domain.

The plurality of output units 131 are configured to serially convert first parallel data, that is, parallel data DATA0<0:3> through DATA15<0:3> in response to the level shifted clock signals to CLK_OUT_LS<0:3>, and generate output data OUT<0:15>.

Figure 7:
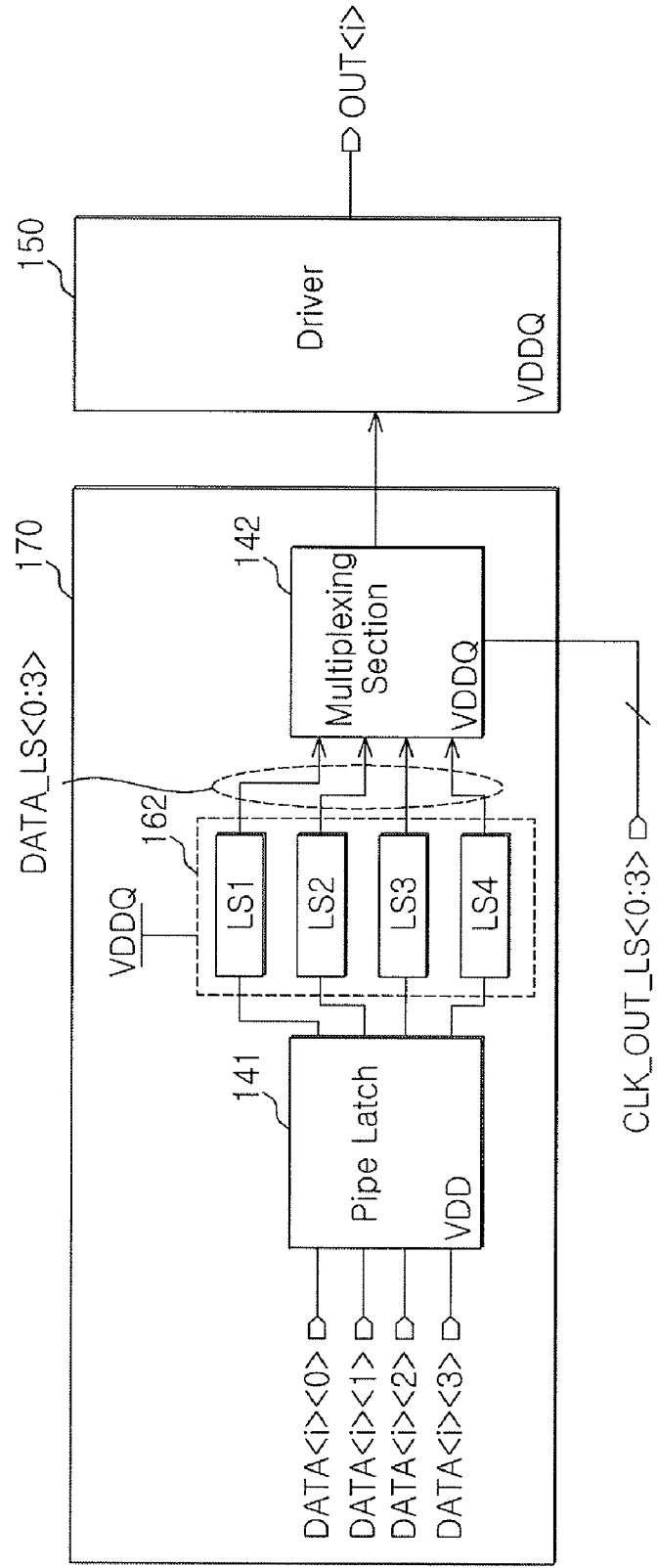
FIG. 7 is a block diagram illustrating the internal configuration of an output unit of FIG. 6.

Referring now to FIG. 7, each of the output units 131 includes a data serializer 170 and a driver 150.

The data serializer 170 includes a pipe latch 141, a data level shifter 162, and a multiplexing section 142.

In this exemplary embodiment, the power domains of the pipe latch 141, the data level shifter 162, and the multiplexing section 142 are VDD, VDDQ, and VDDQ, respectively.

The data level shifter 162 is configured to reconcile the power domain of the data serializer 170 with the power domain of the driver 150.

The data level shifter 162 includes four level shifters LS1 through LS4.

In this embodiment, since the level shifted clock signals CLK_OUT_LS<0:3> are 4-phase, then four level shifters LS1 through LS4 are provided.

In this embodiment, the data level shifter 162 and the power domain changing unit 161 are configured to use the same power domain.

The multiplexing section 142 is configured to select second parallel data, that is, level shifted data DATA_LS<0:3> one by one in response to the level shifted clock signals CLK_OUT_LS<0:3>, and output the selected data as serial data.

The driver 150 is configured to drive the output of the multiplexing section 142 to generate output data OUT<i>. In this exemplary embodiment, i may indicate a number between 0 and 15.

The pipe latch 141 of the data serializer 170 and the driver 150 has different power domains. That is, in this exemplary embodiment, the power domain of the data serializer 170 is VDD, and the power domain of the driver 150 is VDDQ.

Therefore, the data level shifter 162 using the same power domain VDDQ as that of the driver 150 is disposed at an input terminal of the multiplexing section 142.

The multiplexing section 142 also uses VDDQ as a power domain to serially convert the level shifted data DATA_LS_0:3> in response to the level shifted clock signals CLK_OUT_LS<0:3>.

As a result, since the power domain of the data serializer 170 is reconciled with the power domain of the power domain changing unit 161, the level shifted clock signals CLK_OUT_LS<0:3> and the level shifted data DATA_LS<0:3> have substantially the same skew characteristic.

As the level shifted data DATA_LS<0:3> are converted into the serial data in response to the data clock signals CLK_DATA<0:3> on the basis of the above-described principle, it is possible to substantially compensate for a skew misalignment which may occur.

The data level shifter 162 may be configured in the same manner as the power domain changing unit 161. At this time, the four level shifters LS1 through LS4 composing the data level shifter 162 may have the same circuit configuration, and may be configured in such a manner as illustrated in FIG. 8 or 9 to reduce the skew to misalignment occurrence.

Figure 8:
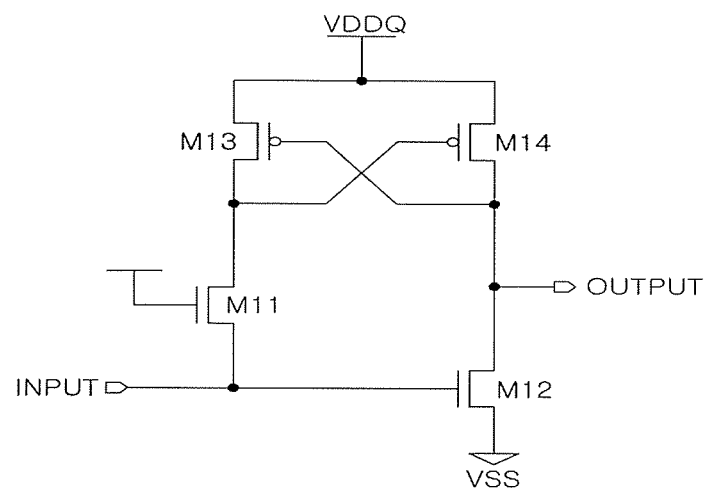
FIGS. 8 and 9 are circuit diagrams of a level shifter of FIG. 7.

That is, as illustrated in FIG. 8, the data level shifter LS1 includes a plurality of transistors M11 through M14. In FIG. 8, as the circuit is configured so as not to substantially separate the phase of an input signal INPUT, it is therefore possible to substantially reduce is the skew mismatch occurrence in the level shifter LS1.

Figure 9:
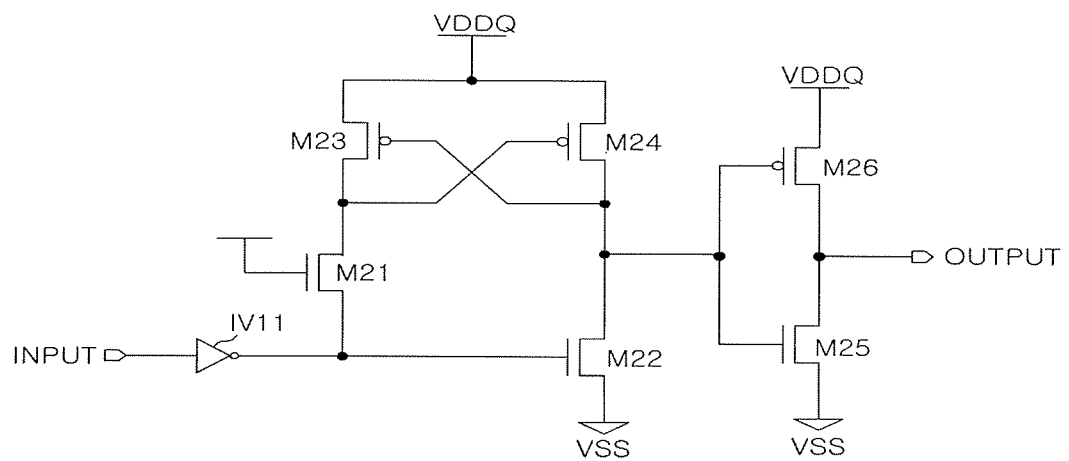

FIG. 9 illustrates another exemplary embodiment of the level shifter LS1. As illustrated in FIG. 9, the level shifter LS1 includes a level shifting logic and an inverter which are connected to each other. The level shifting logic includes a plurality of transistors M21 through M24 and an inverter IV11, and the inverter includes transistors M25 and M26 provided at an output terminal of the level shifting logic. In the level shifter LS1 of FIG. 9, a skew mismatch occurring at the output terminal of the level shifting logic including the plurality of transistors M21 through M24 and the inverter IV11 is substantially offset by the inverter including the transistors M25 and M26.

The operation of the data output circuit 101 according to the embodiment will be described as follows.

As described above, the data output circuit 101 according to the embodiment uses the data level shifter 161 to reconcile the power domains of the data serializer 170 and the driver 150.

Figure 10:
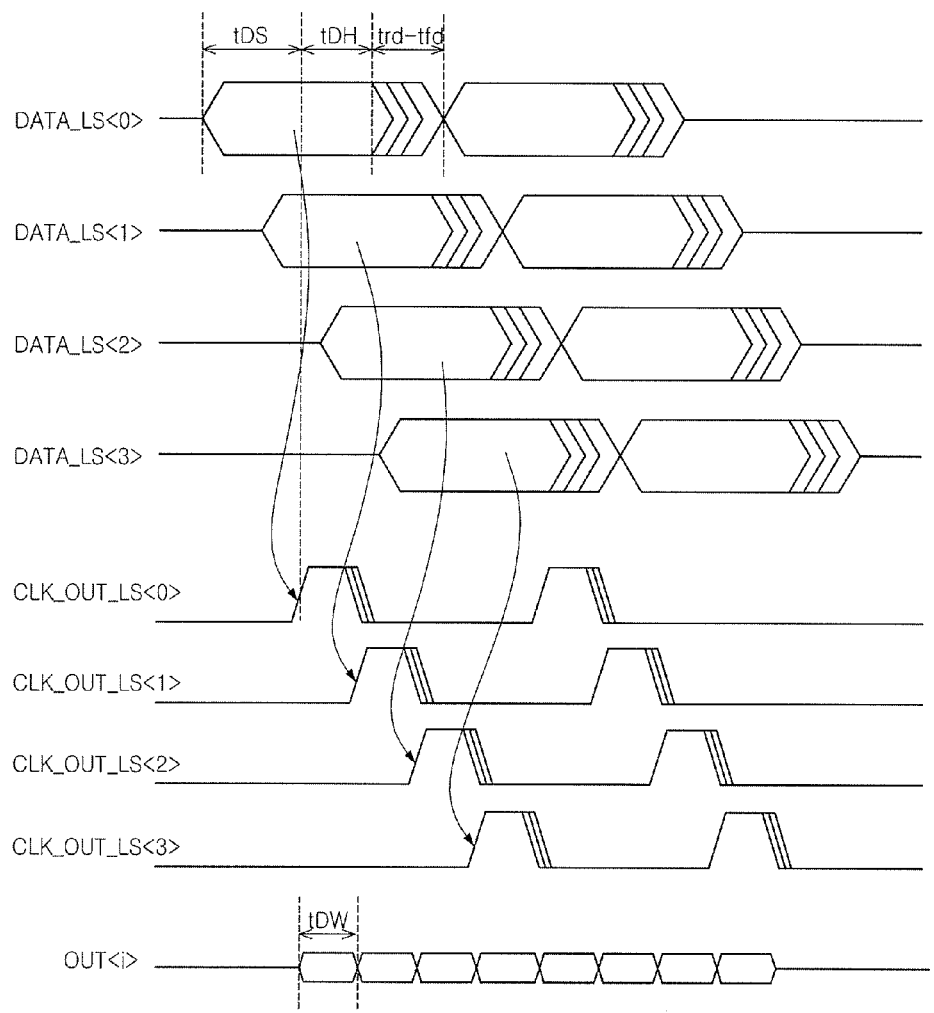
FIG. 10 is a data output timing diagram of the data output circuit according to the embodiment.

Therefore, as illustrated in FIG. 10, the level shifted data DATA_LS<0:3> have a skew corresponding to the absolute value of a difference trd–tfd. Here, trd and tfd represent a rising edge delay time and a falling edge delay time of the parallel data DATA<i><0:3>, respectively.

At this time, the level shifted clock signals CLK_OUT_LS<0:3> for selecting the level shifted data DATA_LS<0:3> use the same power domain as that of the data level shifter 162, and are signals of which the level is shifted by the power domain changing unit 161 configured in the same manner.

Therefore, the level shifted clock signal CLK_OUT_LS<0:3> also have substantially the same skew as that of the level shifted data DATA_LS<0:3>.

When a skew caused by the use of the level shifter or a skew caused by a variation in process, voltage, and temperature (PVT) has an effect upon any one of data and clock signal, the skew characteristic of the output data OUT<0:15> may be degraded.

In the data output circuit 101 according to the embodiment, however, the skew caused by the use of the level shifter or the skew caused by the PVT variation is substantially equally reflected on both of data and clock signal. Therefore, it is possible to improve the skew characteristic of the output data OUT<0:15>.

Furthermore, since the level shifter is designed in such a manner as to reduce the skew, it is possible to further improve the skew characteristic of the output data OUT<0:15>.

While certain embodiments have been described above, it will be understood to those skilled in the art that the embodiments described are by way of example only. Accordingly, the data output to circuit described herein should not be limited based on the described embodiments. Rather, the data output circuit described herein should only be limited in light of the claims that follow when taken in conjunction with the above description and accompanying drawings.

What is claimed is:

1. A data output circuit comprising:
   a data serializer configured to generate serial data using first parallel data; and
   a driver configured to drive the serial data to generate output data,
   wherein the data serializer is configured to generate the serial data by multiplexing second parallel data generated by changing a to power domain of the first parallel data into same power domain as that of the driver.

2. The data output circuit according to claim 1, wherein the data serializer comprises:
   a data level shifter configured to shift a voltage level of the first parallel data to generate level shifted data; and
   a multiplexing section configured to multiplex the level shifted data in response to clock signals, and generate the serial data.

3. The data output circuit according to claim 2, wherein the multiplexing section has a different power domain from that of the driver.

4. The data output circuit according to claim 2, wherein the data level shifter has the same power domain as that of the driver.

5. A data output circuit comprising:
   a power domain changing unit configured to change power domains of a plurality of first clock signals to generate a plurality of second clock signals; and
   an output unit configured to selectively output a plurality of level shifted data generated by shifting voltage levels of a plurality of data, in response to the plurality of second clock signals.

6. The data output circuit according to claim 5, further comprising a repeater configured to receive the plurality of second clock signals to transfer the plurality of second clock signals to the output unit.

7. The data output circuit according to claim 5, further comprising an output control unit configured to receive a plurality of data clock signals that correspond to an activation interval of an output enable signal and to output the plurality of first clock signals to the power domain changing unit.

8. The data output circuit according to claim 5, wherein the output unit comprises:
   a data serializer configured to multiplex the plurality of data in response to the plurality of second clock signals, and to generate serial data; and
   a driver configured to drive the serial data to generate output data.

9. The data output circuit according to claim 8, wherein the data serializer comprises:
   a data level shifter configured to shift the voltage levels of the plurality of data to generate the plurality of level shifted data; and
   a multiplexing section configured to multiplex the plurality of level shifted data in response to the plurality of second clock signals, and to generate the serial data.

10. The data output circuit according to claim 9, wherein the multiplexing section has a different power domain from that of the driver.

11. The data output circuit according to claim 9, wherein the data level shifter has the same power domain as that of the driver.

12. A data output circuit comprising:
    a power domain changing unit configured to change power domains of a plurality of first clock signals having multi-phases and to generate a plurality of second clock signals having multi-phases;
    a plurality of output units configured to commonly receive the plurality of second clock signals and respectively receive a plurality of first data sets; and
    a plurality of repeaters configured to transfer the plurality of second clock signals to the plurality of output units,
    wherein each output unit is configured to selectively output a second data set generated by changing a power domain of the respectively received first data set, in response to the commonly s received second clock signals.

13. The data output circuit according to claim 12, wherein each of the output units comprises:
    a data serializer configured to multiplex the respectively to received first data set in response to the commonly received second clock signals, and to generate the second data set; and
    a driver configured to drive the second data set to generate output data.

14. The data output circuit according to claim 13, wherein the data serializer comprises:
    a data level shifter configured to shift a voltage level of the respectively received first data set to generate the second data set; and
    a multiplexing section configured to multiplex the second data set in response to the commonly received second clock signals, and to generate serial data.

15. The data output circuit according to claim 14, wherein the multiplexing section has a different power domain from that of the driver.

16. The data output circuit according to claim 14, wherein the data level shifter has the same power domain as that of the driver.

* * * * *